United States Patent [19]

Uemura et al.

[11] Patent Number: 4,680,507
[45] Date of Patent: Jul. 14, 1987

[54] LIQUID METAL ION SOURCE

[75] Inventors: Kaoru Uemura, Kokubunji; Tohru Ishitani, Sayamashi; Hifumi Tamura, Hachioji, all of Japan

[73] Assignee: Hitachi, Ltd., Tokyo, Japan

[21] Appl. No.: 669,796

[22] Filed: Nov. 9, 1984

[30] Foreign Application Priority Data

Nov. 11, 1983 [JP] Japan ................................. 58-210854

[51] Int. Cl.⁴ ................................................ H01J 7/24
[52] U.S. Cl. ............................ 315/111.81; 315/111.91;
313/362.1; 313/361.1; 250/423 R; 250/424;
250/427
[58] Field of Search .......................... 313/362.1, 361.1;
315/111.81, 111.91; 250/423, 427, 424;
222/413, 415

[56] References Cited

U.S. PATENT DOCUMENTS 3,756,434  9/1973  Teske .................................. 222/413
4,284,035  8/1981  White ................................. 222/413
4,323,178  4/1982  Longinotti ......................... 222/415
4,328,667  5/1982  Valentian et al. ............... 250/423 F

FOREIGN PATENT DOCUMENTS 0135557  8/1983  Japan ............................ 250/423 R
0101749  6/1984  Japan ............................ 250/423 R Primary Examiner—David K. Moore
Assistant Examiner—Michael Razavi
Attorney, Agent, or Firm—Antonelli, Terry & Wands

[57] ABSTRACT

A liquid metal ion source has a reservoir which holds a source material to-be-ionized in a melted state; an emitter which emits from its tip, ions of the melted source material fed from the reservoir; and an extracting electrode which applies a high electric field to the tip of the emitter, thereby to extract the ions from the tip of the emitter. The liquid metal ion source further comprises tank means for storing the source material to be fed to the reservoir, transfer means for transferring the source material from the tank means to the reservoir, and a vacuum chamber for holding the constituents in a vacuum state.

7 Claims, 9 Drawing Figures

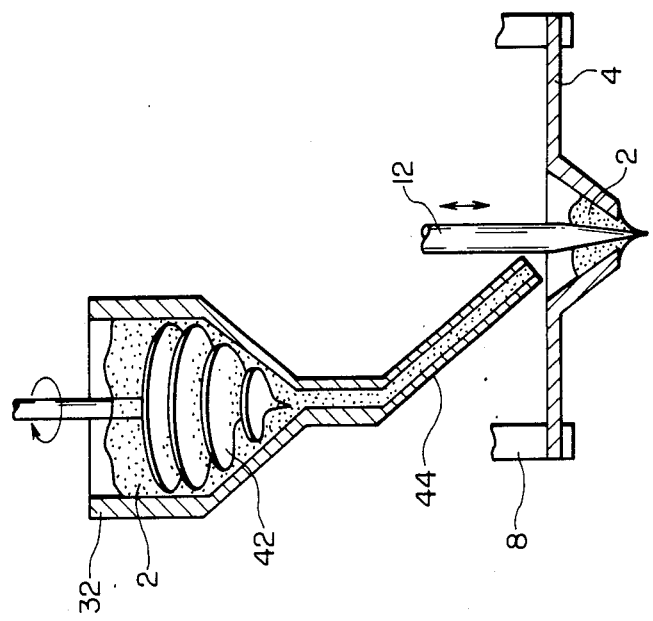
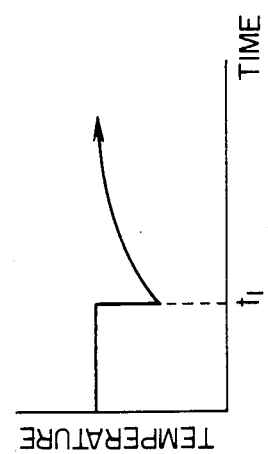
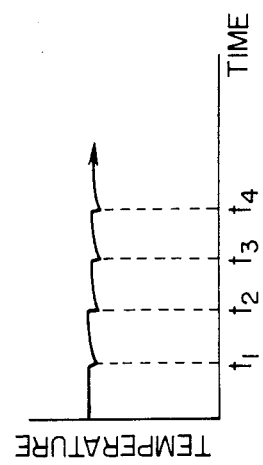

LIQUID METAL ION SOURCE

BACKGROUND OF THE INVENTION

The present invention relates to the structure of a liquid metal ion source which is furnished with tank means for a solid or powdery source material. More particularly, it relates to a liquid metal ion source which is well suited for the long-time continuous operation of the ion microbeam implantation.

FIGS. 1 and 2 show the typical basic setups of prior-art liquid metal ion sources. These two examples of the setups differ in a structure for holding a source material and in a heating method, and are ion sources generally adopted at present.

First, FIG. 1 is a schematic view showing a system wherein a source material 2 is held in direct contact with a heater 4 being a heating portion and is subjected to resistance heating by conducting current. An aperture 10 is provided centrally of the heater 4 which is held by two feedthrough terminals 8 attached to an insulating support 6. The tip of a needle-shaped emitter 12 is located centrally of the aperture 10 and is protruded therefrom. The source material 2 is placed around the aperture 10 so as to lie in contact with the heater 4 as well as the tip of the needle-shaped emitter 12. The source material 2 is melted by the resistance heating based on current fed from a heating power supply 14, and the melted source material wets the tip of the needle-shaped emitter 12. Under this state, a plus high voltage is applied to the needle-shaped emitter 12 by an accelerating power supply 16, and a minus high voltage with respect to the needle-shaped emitter 12 is applied to the side of an extracting electrode 20 by an extracting power supply 18. Thus, the source material 2 in the melted state wetting the tip of the needle-shaped emitter 12 is ionized by field ionization and is extracted as an ion beam 22.

On the other hand, in the setup of FIG. 2, a source material 2 is put in a container 24 such as a crucible, and the tip of a needle-shaped emitter 12 is protruded from an aperture 26 provided at the bottom of the container 24. The heating of the source material 2 is executed by electron-beam bombardment from a heater 4, to heat and melt the source material 2 near the aperture 26. Control electrodes 28a and 28b function to control the flow of the melted source material 2 on the surface of the tip of the needle-shaped emitter 12 by the use of a control power supply 30. Besides, the principle of extracting an ion beam 22 is the same as in the case of the setup example shown in FIG. 1. When the container such as crucible 24 is employed as in this example, the source material 2 heated can be prevented from vaporizing and scattering. Such ion source is described in, for example, Japanese Laid Open Utility Model Publication No. 56-123453 (1981).

These prior-art ion sources have the following problems:

(1) The whole quantity of the source material carried in the ion source needs to be always held in the melted state. Therefore, in a case where the source material is solid or powdery or where it is a material of high melting point, power consumption for heating the source material is high.

(2) In a case where the heater current is constant, the temperature of the source material rises with the decrease thereof, and changes in ion emission characteristics, such as increase in the total ion current, take place.

(3) In a case where the source material is an alloy which consists of metals of greatly different vapor pressures, the proportion of the alloy composition is changed by selective evaporation due to heating for a long time.

(4) The quantity of the source material to be carried is limited by the size of the reservoir or crucible or by an electric capacity for heating, and therefore forms one factor for determining the lifetime of the ion source.

(5) In a case where the ion emission can no longer be expected on account of the consumption of the source material, it is necessary to break the vacuum of the ion source once and to resupply the source material externally. The ion emission is temporarily ceased, the source material is resupplied, and the ion emission is restarted. Then, a long period of time is required immediately after the restart of the emission before ions are stably emitted, and the characteristics of emitted ion currents versus extracting voltages differ from those before the cessation of the ion emission. A period of time is also required for the resupplying operation.

SUMMARY OF THE INVENTION

An object of the present invention is to provide an ion source which can be operated for a long time with an emission ion current stabilized.

The characterizing feature of the present invention consists in a liquid metal ion source comprising a reservoir which holds a source material to-be-ionized in a melted state; an emitter which emits from its tip, ions of the melted source material fed from said reservoir; an extracting electrode which applies a high electric field to the tip of said emitter, thereby to extract the ions from said tip of said emitter; tank means for the source material; and transfer means for transferring said source material from said tank means to said reservoir.

According to the present invention, by enlarging the capacity of tank means for a source material to-be-ionized which is solid powder or liquid, the source material can be stored in a large amount, and stable ion emission can be continued for a long time owing to continuous replenishment. Moreover, since the tank means is independent of a heating portion and a reservoir, the whole quantity of the source material carried in the ion source need not be always held in a melted state, and the power consumption may be nearly equal to that in the prior art. In addition, since the replenishment with the source material can be executed within a vacuum chamber, the change of ion emission characteristics before and after the replenishment, caused by an ion emission intermission for resupplying the source material from outside the vacuum, is avoidable. A further effect is that, in a case where an alloy which consists of metals having greatly different vapor pressures is the source material, selective evaporation ascribable to the heating of the source material for a long time can be avoided by the continuous replenishment with the source material from the tank means.

BRIEF DESCRIPTION OF THE DRAWINGS

FIGS. 4 and 6 are sectional views each showing another embodiment.

FIGS. 5(a) and 5(b) are diagrams for explaining the relationships between the quantity of supply of a source material and the temperature thereof.

DETAILED DESCRIPTION OF THE PREFERRED EMBODIMENTS

Figure 3:
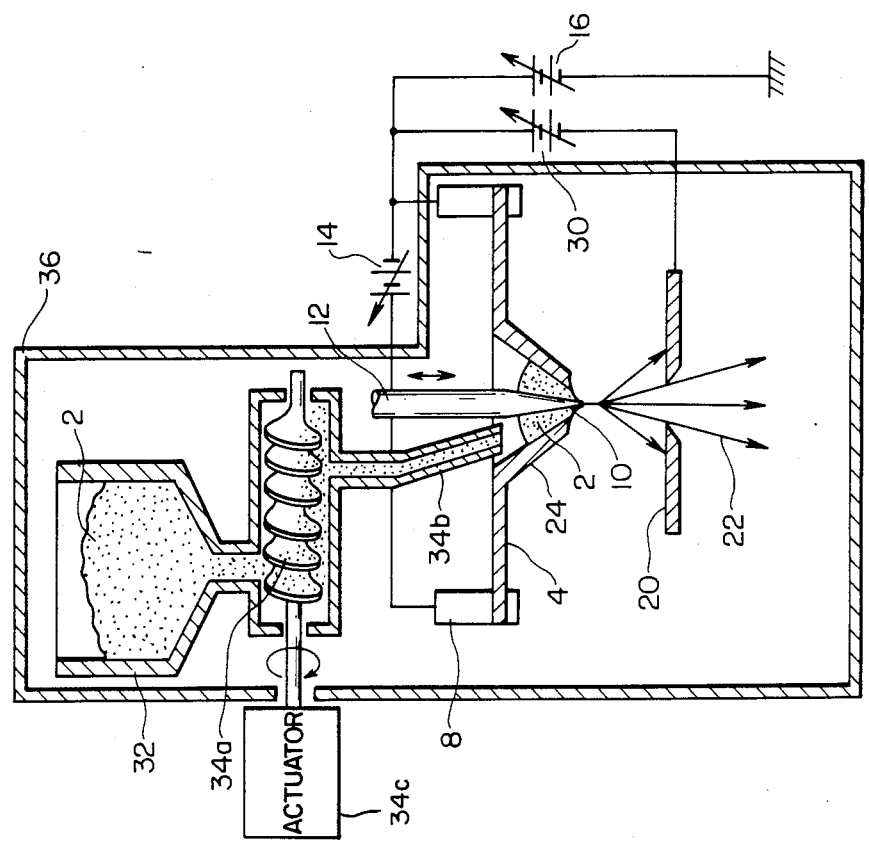
FIG. 3 is a sectional view of a conduction heating type liquid metal ion source embodying the present invention.

Now, an embodiment of the present invention will be described with reference to FIG. 3. This figure shows the basic setup of a liquid metal ion source which comprises, in accordance with the present invention, tank means for a source material and means for transferring the source material to a reservoir or a heating portion.

This liquid metal ion source is of the conduction heating type, in which a reservoir 24 for a source material 2 serves also as a heating portion 4, and resistance heating is executed by conducting current through the heating portion 4 made of carbon, to melt the solid or powdery source material 2 with the resulting heat. The tip of a needle-shaped emitter 12 having a vertically movable mechanism is dipped in the melted source material and is sufficiently wetted, and the flow of the liquid source material 2 from an aperture 10 provided in the bottom of the reservoir 24 is controlled by the vertical motion of the needle tip. Meantime, a minus high voltage is applied to an extracting electrode 20. Thus, the source material 2 adhering to the fore end of the needle-shaped emitter 12 is ionized by field ionization, and an ion beam 22 is extracted. All the constituents of this liquid metal ion source except power supplies 14, 16 and 30 and an end part of a rotary shaft 34a are received in a vacuum vessel 36.

In the present embodiment, NiB (a nickel-boron alloy) was used as the source material 2. In addition, the shape of the heater 4 was such that the recess 24 was provided centrally of the heater 4 in order to prevent the source material 2 from a movement passage 34b therefor from scattering over the heater 4, while it was also used as the reservoir for the source material 2. The loading capacity by which the NiB could be reserved in the recess 24 was about 5 mm$^3$, and the period of time (lifetime) after which stable ion emission was no longer expected was about 100 hours. Of course, the lifetime is not a fixed numerical value because it depends upon the quantity of ion emission (the total ion current value), the quantity of vaporization of the source material by the heating, etc.

Tank means 32 for the source material according to the present invention is larger in capacity than the reservoir 24 of the heater 4. In the present embodiment, about 1 cm$^3$ of granular or powdery NiB which was pulverized to diameters of at most 0.5 mm or so was loaded in the tank means 32.

Regarding the feed rate and feed timing of the source material 2 to the reservoir 24, the helical rotary shaft 34a was rotated by an activator 34c which is provided outside of the vacuum vessel 36, on the basis of the previously measured relationship between the rotational magnitude of the helical rotary shaft 34a and the feed rate of the source material, whereby the source material was fed to the reservoir 24 by about 2 mm$^3$ at intervals of about 50 hours.

Embodiments to be described below have the same fundamental idea in point of disposing the tank means 32 for the source material and the means for moving the source material 2 from the tank means 32 to the reservoir 24 or the heating portion 4, but they have the movement means for the source material 2 improved in mechanism.

In the respective embodiments shown in FIGS. 4 to 8, the power supplies, the vacuum chamber and wiring leads are omitted.

Figure 1:
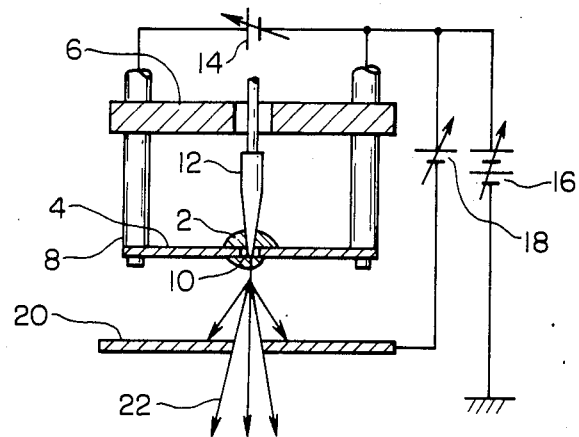
FIG. 1 is a vertical sectional view of a priorart liquid metal ion source of the conduction heating type.
Figure 2:
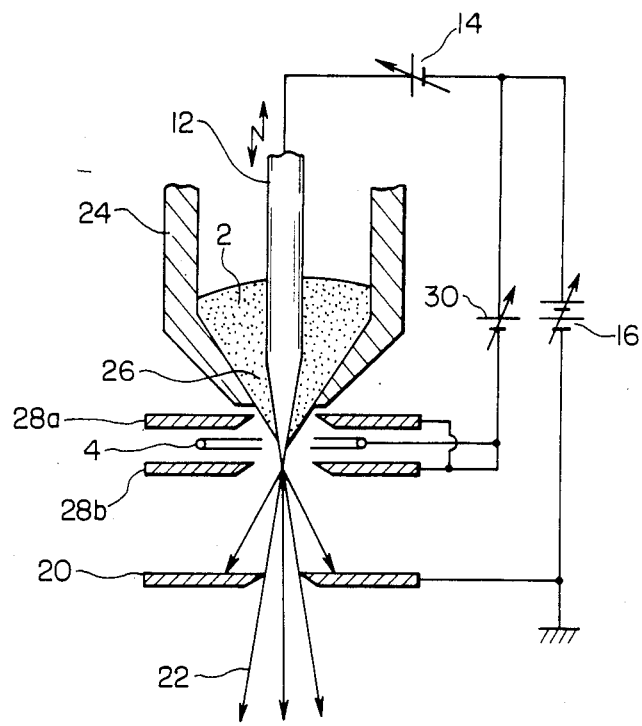
FIG. 2 is a vertical sectional view of a priorart liquid metal ion source of the electron bombardment heating type having a crucible container.
Figure 4:
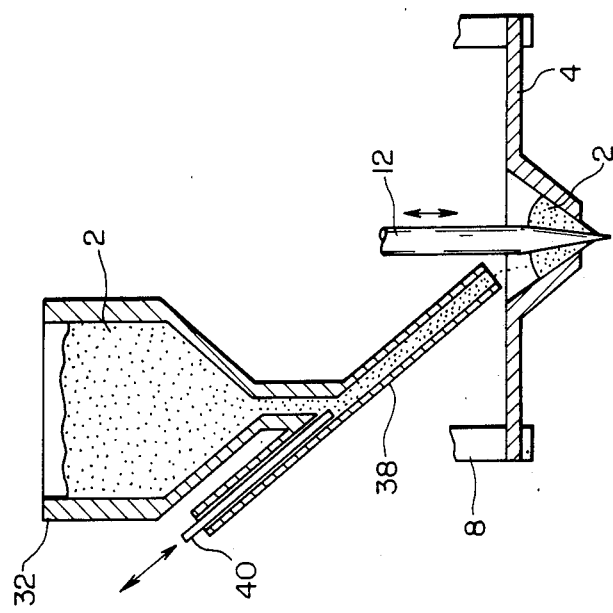

In the embodiment of FIG. 4, a piston 40 is disposed inside a movement passage 38, and the quantity of movement of the source material 2 from the tank means 32 to the heater 4 can be adjusted by the movement of the piston. This piston 40 can be finely adjusted from outside the vacuum chamber by a rectilinear introduction mechanism. This structure is effective for the control of the quantity of movement of the source material which is powder or granules of uniform diameters. There will be explained the reason why the fine adjustment of the quantity of movement of the source material is important. In a case where the source material 2 is fed to the reservoir 24 anew, the source material 2 on the heater 4 is in the melted state. On this occasion, when the source material 2 is fed in a large amount at a stroke, the temperature of the source material on the heater 4 lowers suddenly as illustrated in FIG. 5(a). The temperature lowering changes the ion emission characteristics such as the emission ion current value, or stops the ion emission in an extreme case. It is therefore difficult to continue stable ion emission for a long time. In contrast, when the source material is fed in slight amounts at short time intervals as at times $t_1$, $t_2$, $t_3$ and $t_4$ illustrated in FIG. 5(b), temperature falls are small, and the ion emission characteristics do not fluctuate greatly. It is accordingly important to feed the source material in the slight amount at each time. Therefore, the mechanism is effective in which the rotational angle of the rotary shaft and the feed rate are somewhat correlated as in the embodiment of FIG. 3 or the embodiment of FIG. 6 to be described below. The embodiment of FIG. 4 in which the opening magnitude and opening time of a feed port are correlated with the feed rate is effective for the material such as gallium which is liquid near the room temperature.

In the embodiment shown in FIG. 6, a helical rotary shaft 42 is disposed inside the tank means 32, and the quantity of movement of the source material 2 from the tank means 32 via a movement passage 44 to the heater 4 can be regulated by the rotation of the helical rotary shaft. This structure is effective for the control of the movement quantity of the source material especially in a case where the source material has nonuniform particle diameters as in a pulverized material.

Figure 7:
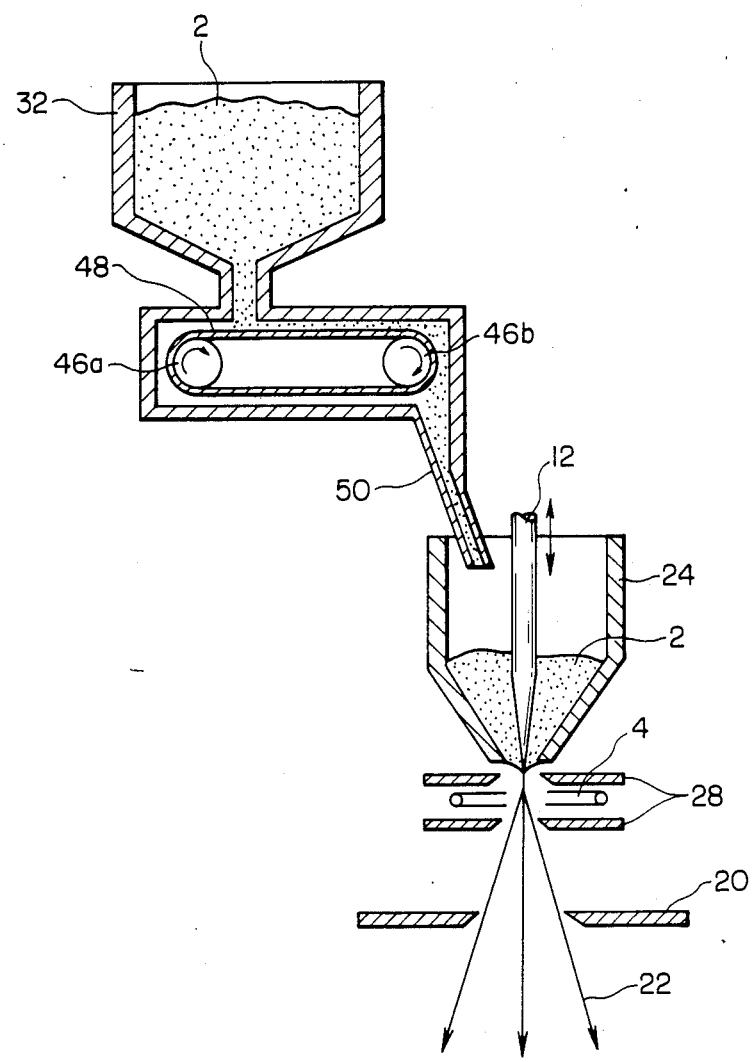
FIGS. 7 and 8 show other embodiments of the present invention, and are, in particular, sectional views of electron bombardment type liquid metal ion sources.

FIG. 7 shows the embodiment in which the tank means 32 and the movement means for the source material 2 are applied to a liquid metal ion source of the electron bombard heating type. In the embodiment of FIG. 7, the source material on a belt 48 can be moved from the tank means 32 via a movement passage 50 to the reservoir 24 by the turning forces of two rotary shafts 46a and 46b, and the quantity of movement of the source material 2 can be regulated by the rotational magnitudes of the rotary shafts 46a and 46b. With this structure, especially the fine adjustment of the movement quantity of the source material 2 is possible because the rotary shafts 48*a* and 48*b* can also be rotated manually from outside the vacuum chamber.

Figure 8:
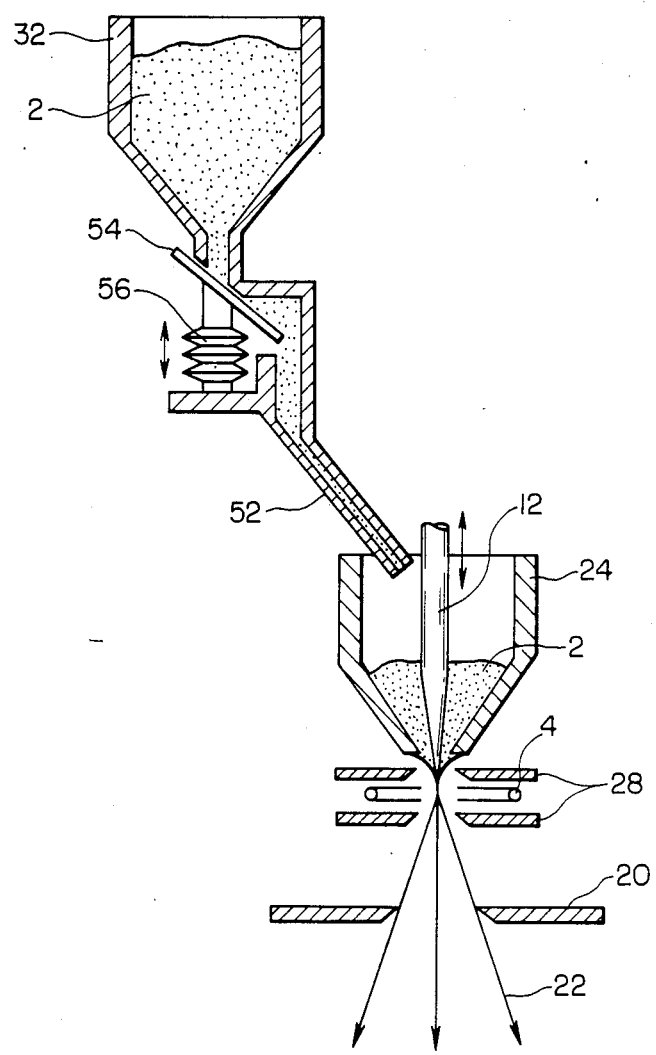

In the embodiment of FIG. 8, a valve 54 is disposed between the tank means 32 for the source material and a movement passage 52, and it is opened and closed through a bellows or spring 56, whereby the quantity of movement of the source material 2 can be regulated.

While the idea of the present invention has been disclosed above, numerous other examples of improvements of the present invention are considered. It is also possible to combine two or more of the illustrative embodiments in FIGS. 4 to 8. The invention is also applicable to liquid metal ion sources each of which employs any heating system different from those mentioned before.

Further, while the emitters of the foregoing embodiments have been the needle-shaped emitters, similar effects can be attained even with an emitter of the capillary type wherein a liquid metal is stored in a capillary tube or an emitter of the capillary needle type wherein a needle-shaped tip is passed in a capillary tube so as to store a liquid metal therebetween.

What we claim is:

1. A liquid metal ion source comprising a reservoir which holds a source material to-be-ionized in a melted state; an emitter which emits from its tip, ions of the melted source material fed from said reservoir; an extracting electrode which applies a high electric field to the tip of said emitter, thereby to extract the ions from said tip of said emitter; tank means for storing the source material which is a particulate material, said tank means having a storage capacity for the particulate source material which is larger than the storage capacity of said reservoir; transfer means for transferring said particulate source material from said tank means to said reservoir, said transfer means being spatially separated from said reservoir so as to inhibit heat transfer from said reservoir to said tank means; and a vacuum chamber for enclosing said reservoir, said emitter, said extracting electrode, said tank means and said transfer means, said vacuum chamber maintaining said reservoir, said emitter, said extracting electrode, said tank means and said transfer means in a vacuum state; whereby said liquid metal ion source is operable for a long time period with a stable ion emission characteristic and reduced power consumption by inhibiting heat transfer.

2. A liquid metal ion source as defined in claim 1, wherein said transfer means is a helical rotary shaft.

3. A liquid metal ion source as defined in claim 1, wherein said transfer means comprises a movement passage which couples said tank means and said reservoir, and valve means which is disposed in said movement passage.

4. A liquid metal ion source as defined in claim 1, wherein said transfer means comprises a plurality of rotary shafts, and a belt which connects said rotary shafts. .

5. A liquid metal ion source as defined in claim 1, further comprising actuating means for actuating said transfer means, said actuating means being provided outside of said vacuum chamber.

6. A liquid metal ion source as defined in claim 1, wherein the particulate material is one of powder and granules of uniform diameter.

7. A liquid metal ion source as defined in claim 1, wherein the particulate material is a pulverized material of nonuniform diameter.

* * * * *